United States Patent [19]
Hasler et al.

[11] Patent Number: 5,606,736
[45] Date of Patent: Feb. 25, 1997

[54] HETERODYNE RADIO RECEIVER WITH PLURAL VARIABLE FREQUENCY LOCAL OSCILLATOR SIGNALS

[75] Inventors: Raymond J. Hasler, Milton Malsor; Oliver P. Leisten, Northampton, both of England

[73] Assignee: SymmetriCom, Inc., San Jose, Calif.

[21] Appl. No.: 336,794

[22] Filed: Nov. 9, 1994

Related U.S. Application Data

[63] Continuation of Ser. No. 913,291, Jul. 14, 1992.

[30] Foreign Application Priority Data

Jul. 16, 1991 [GB] United Kingdom .................. 9115350

[51] Int. Cl.⁶ .................................................. H04B 1/26
[52] U.S. Cl. .................. 455/314; 455/196.1; 455/260
[58] Field of Search ........................... 455/314, 315, 455/318, 319, 334, 22, 207, 196.1, 197.2, 258, 259, 260, 76; 342/357

[56] References Cited

U.S. PATENT DOCUMENTS

| | | | |
|---|---|---|---|
| 3,931,578 | 1/1976 | Gittinger | 325/461 |
| 4,262,361 | 4/1981 | Hauer | 455/113 |
| 4,429,418 | 1/1984 | Hooper | 455/314 |
| 4,476,575 | 10/1984 | Franke | 455/76 |
| 4,521,916 | 6/1985 | Wine | 455/182 |
| 4,580,289 | 4/1986 | Enderby | 455/314 |
| 4,944,025 | 6/1990 | Gehring et al. | 455/207 |
| 5,040,240 | 8/1991 | Keegan | 455/260 |
| 5,163,160 | 11/1992 | Foucher et al. | 455/76 |

FOREIGN PATENT DOCUMENTS

| | | |
|---|---|---|
| 351156 | 7/1989 | European Pat. Off. . |
| 407263 | 6/1990 | European Pat. Off. . |
| 417682 | 9/1990 | European Pat. Off. . |
| 430364 | 11/1990 | European Pat. Off. . |
| 443046 | 11/1934 | United Kingdom . |

OTHER PUBLICATIONS

R. A. Eastwood; "An Integrated GPS/GLONASS Receiver"; pp. 37–43; Institute of Navigation Conference; Jan. 23–25, 1990.

*Primary Examiner*—Reinhard J. Eisenzopf
*Assistant Examiner*—Philip J. Sobutka
*Attorney, Agent, or Firm*—Loeb & Loeb LLP

[57] ABSTRACT

A satellite navigation receiver uses common dual-conversion superheterodyne and frequency synthesizer circuitry for receiving signals from both the GPS and the GLONASS satellite navigation systems. Successive first and second frequency down-converters in the receiver chain are fed by first and second local oscillator signals which are both variable in frequency such that the frequency of the first local oscillator signal is an integral multiple (preferably 8) of the second local oscillator signal. This relationship is provided by a binary divider (32) at least a portion of which may form part of a digital frequency synthesizer loop.

6 Claims, 1 Drawing Sheet

HETERODYNE RADIO RECEIVER WITH PLURAL VARIABLE FREQUENCY LOCAL OSCILLATOR SIGNALS

This application is a continuation of application Ser. No. 07/913,291, filed Jul. 14, 1992, now abandoned.

FIELD OF THE INVENTION

This invention relates to a radio receiver, and in particular to a receiver for satellite navigation and position-fixing.

BACKGROUND OF THE INVENTION

The American GPS (Global Positioning System) and the Russian GLONASS system are both satellite-based position-fixing systems using a number of earth orbiting satellites. Although each is capable of providing a high level of position-fixing accuracy neither is capable of a grade of certainty and coverage to satisfy the needs of the most demanding of applications, such as those of the civil aviation business, in which satellite navigation receivers are used only as "secondary navigation aids". However, use of both systems together gives a much higher grade of certainty since one system can be used to check the other.

The GPS civil position-fixing service makes use of signals transmitted by a number of satellites on a common carrier frequency (LI) of 1575.42 MHz. Since each GPS satellite transmits a unique modulation code it is possible for a single receiver, tuned to the common carrier frequency, to extract data separately from the transmissions of each satellite. In contrast, the GLONASS service has satellites transmitting signals on different frequencies with a common code modulation scheme. Currently, the L1 group of channels comprises 24 channels in the range 1602.5625 MHz to 1615.5000 MHz.

Naturally, it is possible to equip users each with one GPS receiver and one GLONASS receiver, or to build a receiver with largely separate frequency synthesizer and intermediate frequency stages for GPS and GLONASS, but both approaches are costly in comparison with the provision of a single GPS receiver, for example.

It is an object of the present invention to produce a receiver which is capable of receiving signals from different transmission systems having substantially unrelated frequency characteristics and which uses common components for receiving the signals from the different systems to reduce cost.

SUMMARY OF THE INVENTION

According to this invention, there is provided a heterodyne radio receiver having at least two successive frequency down-converters arranged to be fed by respective local oscillator signal sources, wherein, for tuning the receiver to different frequencies, the frequencies of the said sources are variable and related by the expression $f_{LO1}=X.f_{LO2}$, where $f_{LO1}$ and $f_{LO2}$ are the frequencies of a first and a second of the said sources respectively, and X is a fixed integer in at least one mode of the receiver.

The local oscillator signal sources may be provided by a single frequency synthesizer, the second source being formed by the output of a digital frequency divider which has an input associated with the first source. The frequency divider may be a fixed division ratio part of a variable divider chain linking an electrically controlled oscillator and a phase or frequency comparator for comparing the output of the divider chain with a signal the frequency of which is governed by a reference oscillator operable at a reference oscillator frequency. The receiver frequency is variable in a series of regular frequency increments corresponding to the predetermined frequency spacing of a series of transmission channels, with the frequency $f_{LO2}$ of the second source varying in a series of corresponding increments $\Delta f_{LO2}$ each equal to a factor (preferably, the highest factor) common to the frequency spacing and the reference oscillator frequency.

In the case of a receiver operable at UHF frequencies or higher, such as a satellite navigation receiver for receiving satellite signals in L-band, the divider determining the ratio (X) between the frequencies of the first and second local oscillator signal sources is advantageously a binary divider. In the particular dual conversion embodiments of the invention to be described below the ratio (X) is 8 in at least one mode of the receiver. This figure is chosen because, firstly, a convenient reference frequency for satellite navigation receivers is 10 MHz (or a multiple thereof), and the highest common factor of 10 MHz and the GLONASS channel spacing (for the L1 channels) of 0.5625 MHz is 62.5 KHz, and secondly, the ratio X is determined by the relationships:

$$\Delta f_{LO1}+\Delta f_{LO2}=\Delta f$$

and $$\Delta f_{LO1}=\Delta f.X/(X+1)$$

yielding $$X=(\Delta f/\Delta f_{LO2})-1$$

where $\Delta f_{LO1}$ and $\Delta f_{LO2}$ are the frequency increments of the variable local oscillator frequencies and $\Delta f$ is the frequency increment of the input frequency of the receiver (i.e. the channel spacing), so that, putting $\Delta f_{LO2}$=62.5 KHz and $\Delta f$=0.5625 MHz, it is seen that X=8.

DETAILED DESCRIPTION OF PREFERRED EMBODIMENTS OF THE INVENTION

Figure 1:
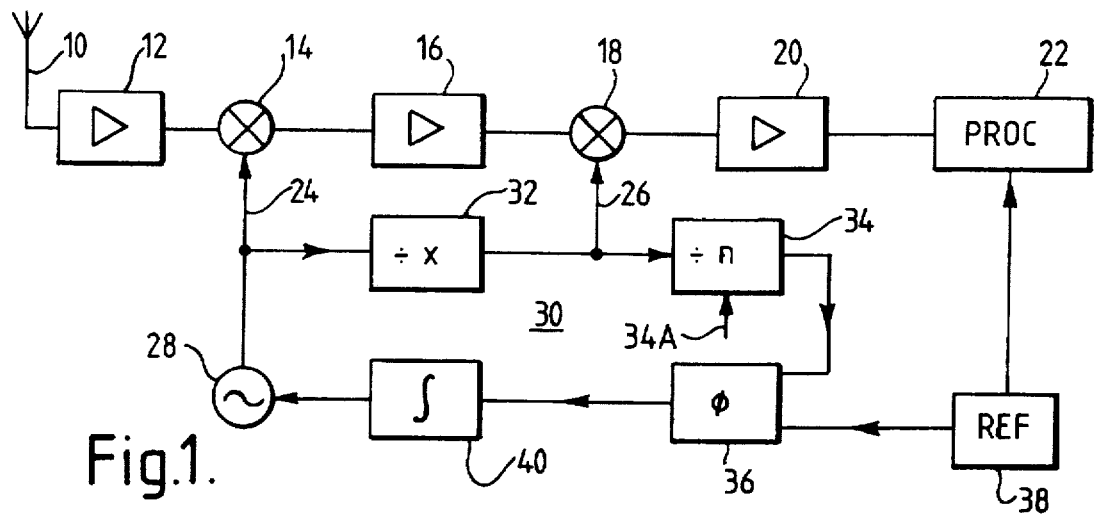
FIG. 1 is a block diagram of a first radio receiver in accordance with the invention.

It has been stated above that a satellite navigation receiver for GLONASS signals can be produced using a reference oscillator of 10 MHz or a multiple of 10 MHz by employing a double-conversion superhet signal chain in which the two down-converters are fed with local oscillator signals the frequencies of which are in the ratio of 8 to 1. Referring to FIG. 1, such a receiver may comprise an antenna 10, an input filtering and amplifying stage 12, a first mixer 14, a first intermediate frequency (i.f) filtering and amplifying stage 16, a second mixer 18, a second i.f filtering and amplifying stage 20, and signal detection and processing circuitry 22. First and second local oscillator signals are fed to the first and second mixers 14, 18 respectively on lines 24 and 26, the source of the first local oscillator signal being a voltage controlled oscillator (VCO) 28 forming part of a frequency synthesizer loop 30. Control of the VCO frequency is established in conventional manner by means of a digital frequency divider chain 32, 34 feeding a phase comparator 36 which also receives a reference signal derived from a reference frequency source 38. The output of the phase comparator 36 is integrated in a low-pass filter stage 40 and applied to the control voltage input of the VCO 28.

In the present case the divider chain includes, firstly, a fixed divider 32 which acts as a prescaler for dividing the VCO frequency by a constant integer X and, secondly, a variable divider 34 for further division by a variable number n according to settings signalled via control input 34A. Coupled to the output of the fixed divider 32 is the local oscillator input of the second mixer 18 so that the second local oscillator frequency $f_{LO2}$ is equal to $f_{LO1}$ divided by X, X being 8 in this example.

The GLONASS satellite navigation system currently transmits signals on 24 channels between 1602.5625 MHz and 1615.5000 MHz separated by increments of 0.5625 MHz. These are often referred to as the GLONASS "L1" channels, 24 out of 32 channel allocations actually being used at present. Conventionally, in a single loop frequency synthesizer for a receiver receiving such signals, a comparison frequency (at the phase comparator) of 0.5625 MHz might be chosen to allow switching between channels by altering the division ratio of the variable divider in increments of 1, and to give adequate synthesizer response speed and noise performance. However, such a comparison frequency cannot be obtained by direct division from a reference crystal oscillator running at 10 MHz, 20 MHz or, perhaps, 40 MHz. These frequencies are convenient for use in GPS satellite navigation receivers due to the speed requirements of the processing circuitry and the ease with which a calendar time reference can be generated for predictive acquisition of satellite signals. Indeed, stages such as frequency multipliers or non-linear mixers are required, together with filters for blocking unwanted frequency components, which are expensive in relation to dividers and, in the case of filters particularly, are difficult to incorporate in integrated circuit devices.

Instead, the receiver of FIG. 1 uses a comparison frequency of 62.5 KHz, which is the highest common factor of 10 MHz and the channel spacing 0.5625 MHz. By selecting a division ratio of 8 for the fixed divider 32 and taking the output of that fixed divider as the local oscillator input for the second mixer, it will be seen that the receiver can be tuned to the 24 GLONASS channels by altering the division ratio n of the variable divider 34 in steps of 1, and by dividing the reference frequency 10 MHz in a reference divider (not shown in FIG. 1) by 160, i.e. without frequency multipliers or other complex components.

In terms of precise frequencies and division ratios, the frequency synthesizer may be arranged to produce first and second local oscillator frequencies of 1402.0 MHz and 175.25 MHz respectively to receive channel 1 (1602.5625 MHz), yielding a first i.f of 200.5625 MHz and a second i.f of 25.3125 MHz. The division ratio n is 2804. Changing the division ratio n to 2827 produces first and second local oscillator frequencies of 1413.5 MHz and 176.6875 MHz for receiving channel 24 (1615.5000 MHz). The second i.f remains constant at 25.3125 MHz. It will be noted now that the first i.f has changed to 202.0000 MHz. In fact, as the receiver is tuned from channel to channel, the first i.f frequency changes in steps of 62.5 KHz together with the second local oscillator frequency. A change of first i.f frequency of this order is acceptable and can be accommodated within the first i.f filter bandwidth. It will also be noted that the first local oscillator frequency is incremented in steps of 0.5 MHz, i.e 8 times the increments of the second local oscillator frequency and one 20th of a reference oscillator frequency of 10 MHz.

The above example uses local oscillator signals having frequencies which are lower than the input and first i.f frequencies respectively. Arrangements of one higher and one lower or two higher frequencies are also possible, still using the same division ratio between the two local oscillator frequencies. In other words, the relationship $X=(\Delta f/\Delta f_{LO2})-1$ holds true in each case.

It is possible, within the scope of the invention to choose common factors of the channel spacing and the reference oscillator frequency which are not the highest common factor. Thus, for example, the second local oscillator frequency may be incremented in steps of 31.25 KHz or 20.8333 KHz, with X equal to 17 or 26 respectively. However, these result in lower comparison frequencies, which has disadvantages as will become clear below.

By appropriate selection of a fixed value for the variable division ratio n, by switching in a different first i.f filter, by alteration of the comparison frequency, if required, and by changing the division ratio of the reference divider in the reference frequency source 38, the receiver of FIG. 1 can be used to receive GPS signals on the GPS L1 frequency of 1575.42 MHz.

The receiver described above with reference to FIG. 1 does have the disadvantage that the comparison frequency may not be sufficiently high to avoid limiting synthesizer switching speed undesirably. A higher comparison frequency is also preferable for reducing noise in the synthesizer loop, since loop noise is related to the ratio of the VCO frequency (the first local oscillator frequency) and the comparison frequency.

Figure 2:
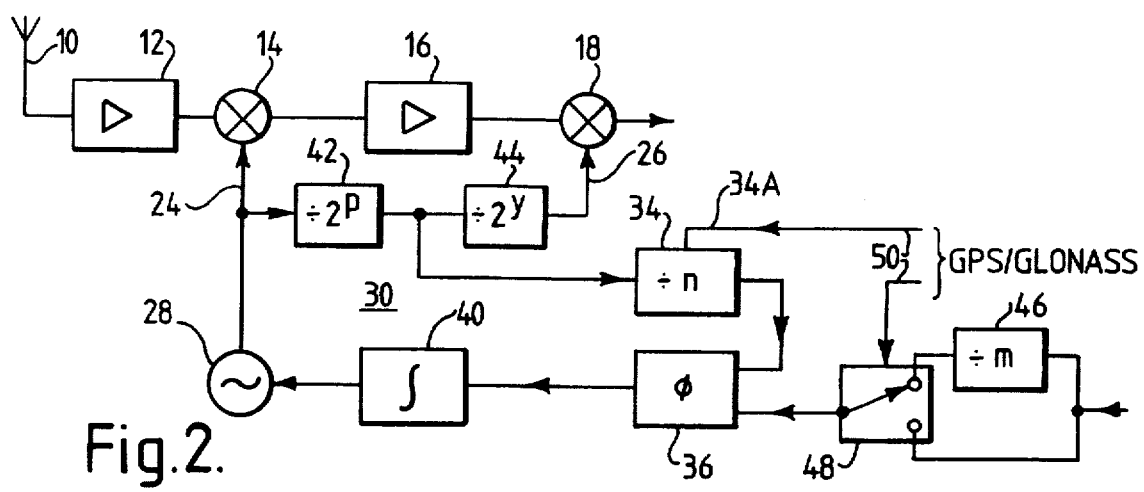
FIG. 2 is a block diagram of part of a second radio receiver in accordance with the invention.

However, it is possible to trade the bandwidth of the variable divider for frequency changing agility and synthesizer loop noise. Referring to FIG. 2, this is achieved by reducing the overall division ratio in the loop 30 by, for example, taking the input for the variable divider 34 from a point further "upstream" than in the loop of the previous example (shown in FIG. 1). Thus, the input to the variable divider 34 may be coupled to a "tap-off" point between the two fixed ratio dividers 42, 44 which together, perform the same function and have the same overall division ratio X as the single divider 32 in the previous example.

To take, again, the example of X=8, dividers 42 and 44 are binary dividers with division ratios $2^p$ and $2^y$ respectively, where p+y=3. It will be seen that if p=1, and the variable divider 34 is unchanged compared with the first example, the comparison frequency is raised from 62.5 KHz to 250 KHz. Indeed, it is possible to make p=0 and eliminate the divider 42 altogether so that the comparison frequency becomes 500 KHz.

However, whether the variable divider 34 takes its input from the end output of the fixed divider section, or from a "tap-off" point, or directly from the output of the VCO 28, the division ratio between the inputs 24, 26 of the mixers 14, 18 remains the same.

The example of FIG. 2 is particularly susceptible for use in a combined GPS/GLONASS receiver, because with p=0 and a comparison frequency of 0.5 MHz in the GLONASS mode, a 10 MHz reference frequency may be used with a simple reference divider 46 having a division ration m equal to 20. Interposing a switch 48 in the reference circuitry as shown to allow bypassing of the reference divider 46 enables the comparator 36 to be operated at 10 MHz in the GPS mode, the variable divider 34 being operated with a fixed division ratio of 128. Both the switch 48 and the divider 34 are controlled via control inputs 50 when switching between modes. This particular example produces a first i.f of 295.42 MHz in GPS mode and, therefore, needs different i.f filtering in the two modes. In some circumstances, frequencies and division ratios may be selected to avoid the need to change the first i.f filtering between modes.

Figure 3:
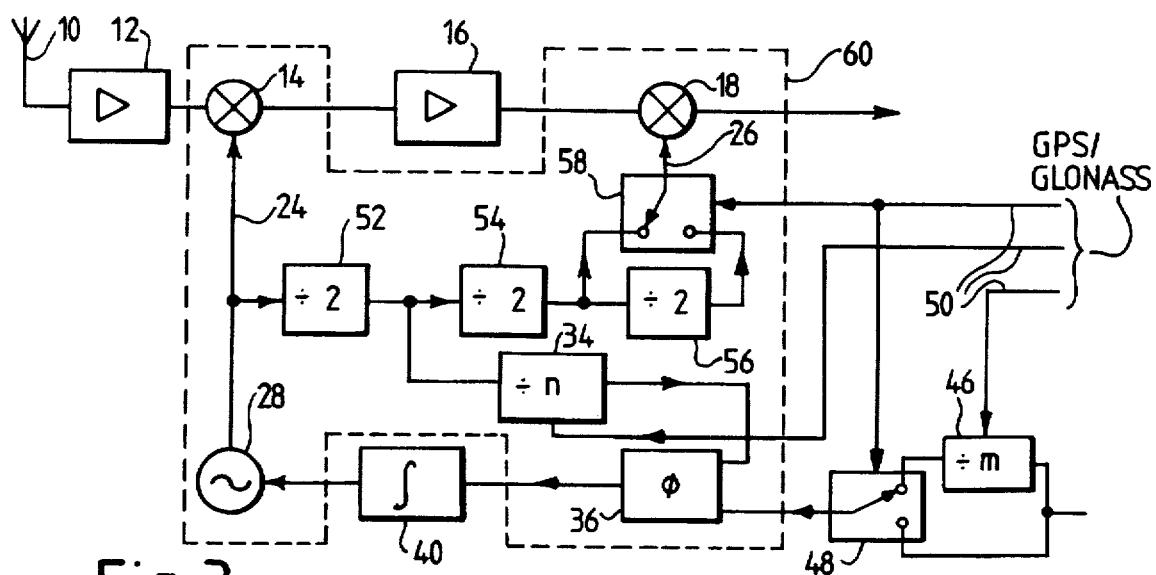
FIG. 3 is a block diagram of part of a third radio receiver in accordance with the invention.

Further possibilities can be realised by altering the division ratio of the divider feeding the second mixer 18 when switching to GPS mode, as shown in FIG. 3. Referring to FIG. 3, this divider is split into three parts 52, 54 and 56, each a simple binary divider dividing by 2. The input 26 to the second mixer 18 is taken from the output of divider 56 or from the output of divider 54 according to the position of a second electronic switch 58. In GLONASS mode, the switch 58 is operated to connect the mixer 18 to the output of divider 56 to give the required ratio of 8 between the first and second local oscillator signals. In GPS mode, the mixer is instead switched to the output of the divider 54 so that the ratio between the local oscillator signals is now 4. At the same time, as in the FIG. 2 embodiment, the reference divider 46 is bypassed to alter the comparison frequency, except that in this case the reference frequency and the division ratio m of the reference divider 46 are 40 MHz and 160 respectively. In GPS mode, the division ratio of the variable divider 34 is held at 16.

To minimise cost the receivers described above have been designed, as far as possible, to allow the majority of their components to be embodied in an integrated circuit or circuits. To take the example of FIG. 3, the dotted line 60 indicates some of the components that may be integrated on a chip. In practice, much of the reference source circuitry can also be "on chip" as well as some of the amplifier circuitry in the radio frequency and subsequent stages. The variable divider 34 can be "off-chip" if required, an option which is of particular interest if the chip is to be used as the basis of an integrated circuit which can be incorporated in the radio frequency stages of either a GPS receiver, or a GLONASS receiver, or a combined GPS/GLONASS receiver, since the GPS only receiver does not require the variable divider and a fixed ratio divider can be substituted.

The invention includes such an integrated circuit receiver or synthesizer chip as another aspect of the inventive concept, the chip including at least divider means operable to divide a first local oscillator signal by a fixed integer, preferably the integer 8, to produce a second local oscillator signal. The chip may include one or more of the other elements as shown in FIG. 3.

What is claimed is:

1. A superheterodyne radio receiver comprising at least two successive frequency down-converters arranged to be fed by respective first and second local oscillator signal sources, and further comprising a frequency synthesizer providing signal sources and a reference oscillator coupled to said synthesizer, said reference oscillator operable at a reference oscillator frequency, wherein, for tuning the receiver to a plurality of different receiving frequencies separated by the predetermined equal frequency spacing of a series of transmission channels, the frequencies of the said sources are variable and related by the expression $f_{LO1} = X_1 f_{LO2}$, where $f_{LO1}$ and $f_{LO2}$ are the frequencies of said first and said second of the said sources, respectively, and x is a fixed integer in at least one mode of operation of the receiver, and means for varying the frequency $f_{LO2}$ of said second source in a series of frequency increments $\Delta f_{LO2}$ associated with said equal frequency increments and equal to a factor common to said equal frequency spacing and said reference oscillator frequency, having only two frequency down-converters, wherein said frequency synthesizer is arranged such that the frequencies of said local oscillator signal sources are variable in respective increments $\Delta f_{LO1}$ and $\Delta f_{LO2}$ such that the sum $(\Delta f_{LO1}+\Delta f_{LO2})$ is equal to the predetermined frequency spacing, and wherein the integer X is equal to 8.

2. A receiver according to claim 1 wherein said reference oscillator frequency is a multiple r of 10 MHz, where r=1, 2, 3, etc.

3. A superheterodyne radio receiver comprising at least two successive frequency down-converters arranged to be fed by respective first and second local oscillator signal sources, and further comprising a frequency Synthesizer providing signal sources and a reference oscillator coupled to said synthesizer, said reference oscillator operable at a reference oscillator frequency, wherein, for tuning the receiver to a plurality of different receiving frequencies separated by the predetermined equal frequency spacing of a series of transmission channels, the frequencies of the said sources are variable and related by the expression $f_{LO1} = X_1 f_{LO2}$, where $f_{LO1}$ and $f_{LO2}$ are the frequencies of said first and said second of the said sources, respectively, and x is a fixed integer in at least one mode of operation of the receiver, and means for varying the frequency $f_{LO2}$ of said second source in a series of frequency increments $\Delta f_{LO2}$ associated with said equal frequency increments and equal to a factor common to said equal frequency spacing and said reference oscillator frequency, wherein said first and second local oscillator sources are constituted by said frequency synthesizer, said synthesizer having a digital frequency divider, which has an input associated with the first said source and an output forming the second said source, wherein said digital frequency divider comprises first and second binary divider portions connected in series and having division ratios of $2^p$ and $2^q$ respectively, where p and q are integers and p+q=3 in at least one mode of operation of the receiver, and wherein said frequency synthesizer further comprises a variable divider having an input coupled to the output of said first divider portion, a phase comparator having one input couple to an output of said variable divider and another input coupled to said reference oscillator, and a variable frequency oscillator coupled to an output of said comparator.

4. A receiver according to claim 3, wherein said reference oscillator comprises a reference frequency divider, the receiver further comprising mode switching means associated with said reference frequency divider and said variable divider for allowing configuration of the receiver in one mode of operation as a fixed frequency receiver with a fixed synthesizer loop division ratio and with first reference and comparison frequencies and, in another mode of operation, as a variable frequency receiver with a variable synthesizer loop division ratio and with second reference and comparison frequencies.

5. A superheterodyne radio receiver comprising at least two successive frequency down-converters arranged to be fed by first and second respective local oscillator signal sources, and further comprising a frequency synthesizer providing the said first and second signal sources, and a reference oscillator coupled to said synthesizer, said reference oscillator operable at a reference oscillator frequency, wherein, for tuning the receiver to a plurality of different receiving frequencies separated by predetermined equal frequency spacing of a series of transmission channels:

the frequencies of the said first and second sources are variable in a respective series of frequency increments associated with said different receiving frequencies;

the frequency of said first source being a constant integer multiple of the frequency of said second source; and said predetermined frequency spacing being integer divisible by the frequency increment of said second source, having two frequency down-converters, wherein said frequency synthesizer is arranged such that the frequency increments $\Delta f_{LO1}$ and $\Delta f_{LO2}$ of said first and second local oscillator signal sources feeding the two down-converters are related by the expressions:

$$\Delta f_{LO1} + \Delta f_{LO2} = \Delta f$$

where $\Delta f$ is the said predetermined frequency spacing, and $$X = (\Delta f / \Delta f_{LO2}) - 1$$

where x is the ratio between the variable local oscillator frequencies.

6. A receiver according to claim 5, wherein the ratio X is equal to 8.

* * * * *